(12) United States Patent
Nguyen et al.

(10) Patent No.: US 7,268,602 B2
(45) Date of Patent: Sep. 11, 2007

(54) METHOD AND APPARATUS FOR ACCOMMODATING DELAY VARIATIONS AMONG MULTIPLE SIGNALS

(75) Inventors: David Nguyen, San Jose, CA (US); Suresh Rajan, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 10/964,737

(22) Filed: Oct. 15, 2004

(65) Prior Publication Data

US 2005/0068082 A1 Mar. 31, 2005

Related U.S. Application Data

(63) Continuation of application No. 10/075,531, filed on Feb. 13, 2002, now Pat. No. 6,998,892.

(51) Int. Cl.
*H03L 7/06* (2006.01)
(52) U.S. Cl. .................................... 327/158; 327/159
(58) Field of Classification Search ........ 327/108–112, 327/156–159; 375/375, 376
See application file for complete search history.

(56) References Cited

U.S. PATENT DOCUMENTS

| 5,197,082 | A | * | 3/1993 | Uda et al. ................ 375/214 |
|---|---|---|---|---|
| 5,594,762 | A | * | 1/1997 | Joo et al. ................. 375/371 |
| 5,694,062 | A | * | 12/1997 | Welch et al. ................ 327/3 |
| 5,742,798 | A | | 4/1998 | Goldrian |
| 5,883,854 | A | | 3/1999 | Becker |
| 5,943,291 | A | | 8/1999 | Manning |
| 6,021,089 | A | | 2/2000 | Hwang |
| 6,137,850 | A | * | 10/2000 | Miller ..................... 375/354 |
| 6,351,172 | B1 | | 2/2002 | Ouyang et al. |
| 6,430,725 | B1 | | 8/2002 | Reichle et al. |
| 6,856,206 | B1 | * | 2/2005 | Perrott ..................... 331/25 |

FOREIGN PATENT DOCUMENTS

JP 2000035831 A 2/2000

* cited by examiner

*Primary Examiner*—Kenneth B. Wells
(74) *Attorney, Agent, or Firm*—Hunton & Williams LLP

(57) ABSTRACT

A method and apparatus for accommodating delay variations among multiple signals are provided. According to one embodiment of the invention, transitions of one or more of a plurality of lines between different levels are detected. The timing of a signal affecting recovery of information from the plurality of lines is adjusted according to the transitions detected. Examples of such a signal include one or more signals carried on one or more of the plurality of lines and a timing signal carried on a line separate from the plurality of lines.

31 Claims, 11 Drawing Sheets

METHOD AND APPARATUS FOR ACCOMMODATING DELAY VARIATIONS AMONG MULTIPLE SIGNALS

CROSS-REFERENCE TO RELATED APPLICATIONS

This patent application is a continuation of U.S. patent application Ser. No. 10/075,531, filed Feb. 13, 2002 now U.S. Pat. No. 6,998,892, which is hereby incorporated by reference herein in its entirety.

FIELD OF THE DISCLOSURE

The invention relates generally to techniques for communicating multiple signals and, more particularly, to a method for accommodating delay variations among multiple signals.

BACKGROUND

Parallel data buses are often used to interconnect integrated circuit devices. In a parallel synchronous bus, data is generally supplied onto the bus by a first integrated circuit device for a second integrated circuit device to read. The second device clocks in the data on an edge of a clock signal. Accordingly, the data must be set up and stable on the data input terminals of the second device for a period of time before the edge of the clock signal that causes the second device to clock in the data. Bus specifications generally require that data be stable for some "set up time" before the clock edge that clocks in the data. Bus specifications generally also require that the data remain stable until some "hold time" after the clock edge.

FIG. 1 (Prior Art) illustrates three bus cycles. The data supplied onto the bus in the first cycle is D1, the data supplied onto the bus in the second cycle is D2, and the data supplied onto the bus in the third cycle is D3. The data is clocked into the receiving device on the rising edge of the clock signal CLK. The specifications of the bus require that the data for a bus cycle be set up and stable by the "set up time" TS before the rising edge of the clock, and that the data for the bus cycle remain valid until a "hold time" TH after the rising edge of the clock.

In a synchronous system, the rate or frequency at which data can be sent between two devices that are connected by means of a parallel bus is a function of the clock to output delay of the transmitting device, the setup and hold time of the receiving device, clock jitter, the clock skew between the two devices, the propagation delay associated with the bus, and other physical phenomena that cause timing uncertainty at the receiver. In a source synchronous system, the clock skew between the devices and the propagation delay associated with the bus do not affect the frequency of operation. Physical phenomena like simultaneous switching output (SSO) noise, pattern dependent propagation delay, and crosstalk all cause uncertainty in the timing of the data signals at the input of the receiving device. That is, they affect the position of the data valid window with respect to the clock. This uncertainty in the timing of the data valid window with respect to the clock is, to a large extent, dependent on the data pattern itself.

In some integrated circuit devices, a problem arises when the data being output onto the bus switches in a particular way. When an output buffer switches from driving a digital logic high ("high") to driving a digital logic low ("low"), the capacitance of the output terminal and external wire attached to it must be discharged through the output buffer in order for the voltage on the output terminal to transition from the higher voltage ("high") to the lower voltage ("low"). If many output buffers simultaneously switch in this way from outputting a "high" to outputting a "low," and if all the output buffers share a common ground bus, then a spike of current will be sinked into the ground bus during the period of switching. If the ground bus has an appreciable inductance and if all of the current spike flows through that inductance, then the current spike may cause the instantaneous voltage on the ground bus to rise. This phenomena is called "ground bounce." Such ground bounce generally reduces the difference between the supply voltage (VDD) and the ground voltage (GND) for the output buffer, thereby reducing the ability of the output buffer to sink current. Reducing the ability of the output buffer to sink current reduces the high-to-low switching speed of the output buffer. If, for example, there is a sixteen bit data bus and all the sixteen bits switch from "high" to "low," then the sixteen output buffers may be slowed to a significant degree.

While ground bounce may affect a ground bus, a similar condition, referred to as "VDD droop" or "voltage droop," can affect conductors carrying a supply voltage. If a substantial current is drawn through a conductor providing a supply voltage, for example a substantial transient current incident to switching of semiconductor devices during a logic transition, a significant voltage drop can occur across the conductor providing the supply voltage, thereby effectively lowering the supply voltage. As with ground bounce, voltage droop can also lead to a reduction of the switching speed of logic devices, for example an output buffer. Thus, transitions in signals processed by such logic devices may occur later or more slowly than they otherwise would. The difficulty in finding a satisfactory solution to this problem has been exacerbated by the insidious nature of the problem itself, in that the slowing of transitions can result from current drawn as a consequence of the mere presence of the transitions. Hence, the slowing, delay, or degradation that occurs in the presence of transitions can be referred to generally as transition-induced delay.

The relative effects of ground bounce and voltage droop may vary according to several factors. For example, the sizes and geometries of transistors may affect the susceptibility of a circuit to ground bounce and VDD droop. For example, in a circuit with larger p-channel metal oxide semiconductor (PMOS) transistors, the larger PMOS transistors may carry more current, resulting in less sensitivity to voltage droop. However, such a circuit may still be affected by significant ground bounce. As another example, various parasitics may also affect the relative influence of ground bounce and VDD droop. Such parasitics can include, for example, parasitic capacitances resulting from a conductor being routed in proximity to another conductor or electrical structure. Integrated circuit packaging and pin assignment (e.g., the number of pins assigned to carry signals as compared to the number of pins assigned to carry power, such as a supply voltage or ground).

Circuits exhibiting different relative susceptibilities to ground bounce and VDD droop may exhibit different transition-induced delay characteristics depending on the directions of the transitions. For example, a rising transition and a falling transition may have different effects on the amount of current flowing through the ground bus and the voltage supply conductor.

FIG. 2 (Prior Art) illustrates an example of transition-induced delay. From the second bus cycle to the third bus cycle, many data bits switch, thereby slowing the transition of the data from data value D2 to data value D3. This delay causes a set up time violation in that data value D3 is not stable by the set up time TS before the third rising edge of the clock CLK.

The output register and data buffer circuitry could be designed to output the data earlier with respect to the clock signal CLK to compensate for the slowness of the output buffer, but then a different problem might present itself in a high speed bus design. FIG. 3 (Prior Art) illustrates this situation. If relatively few of the bits on the data bus switch, then no substantial transition-induced delay occurs. Thus, for a bit that does switch, the output buffers may switch so fast that the hold time TH for the prior cycle (in this case, the second bus cycle) will be violated. In the example of FIG. 3, the data value D2 is removed before the required hold time TH from the second rising edge of the clock.

While ground bounce and VDD droop can affect switching speeds and adversely affect timing relationships, similar effects can result from the influence of conductors in close proximity to one another. For example, propagation delay of a signal through a conductor in a heterogeneous environment (e.g., a microstrip line on an integrated circuit (IC) package substrate or printed circuit (PC) board) is dependent on signals on other conductors in close proximity. The nominal propagation delay of a signal through a conductor is a function of the conductor geometry and the material properties of the dielectric materials surrounding the conductor.

However, when signals on neighboring conductors have the same phase as the affected signal (e.g., have simultaneous transitions of polarity similar to that of the affected signal), which may be referred to as an even mode pattern, then the propagation delay of the affected signal is increased. When the signals on the neighboring conductors have phases opposite that of the affected signal (e.g., have Simultaneous transitions of polarity opposite that of the affected signal), which may be referred to as an odd mode pattern, then the propagation delay of the affected signal is decreased. Such phenomena result in pattern-dependent delay that can cause timing uncertainty at a receiver of the affected signal. A solution to these problems is desired.

DETAILED DESCRIPTION OF THE INVENTION

A method and apparatus for accommodating delay among multiple signals are described. According to one embodiment of the invention, patterns of data or transitions of one or more of a plurality of lines between different levels are detected. The timing of a signal affecting recovery of information from the plurality of lines is adjusted according to the transitions detected. Such adjustment may be based on various characterizations of the patterns or transitions. For example, a total number of transitions from one logic level to a different logic level may be used as a basis for adjustment. The nature of the adjustment may be different or similar depending on the types of transitions detected. For example, a different amount of adjustment may be used for high-to-low transitions than for low-to-high transitions. The adjustment may be based on a relationship between respective numbers of transitions of different types, for example, the difference (or absolute value thereof) between high-to-low transitions and low-to-high transitions. Transitions may be detected from all of the plurality of lines or from a subset thereof. For example, transitions may be detected from a subset of the lines sharing a common electrical topology. Such a common electrical topology may exist, for example, if all of the subset of the lines are coupled to a common conductor, such as a supply voltage conductor or a ground bus conductor.

Figure 1:
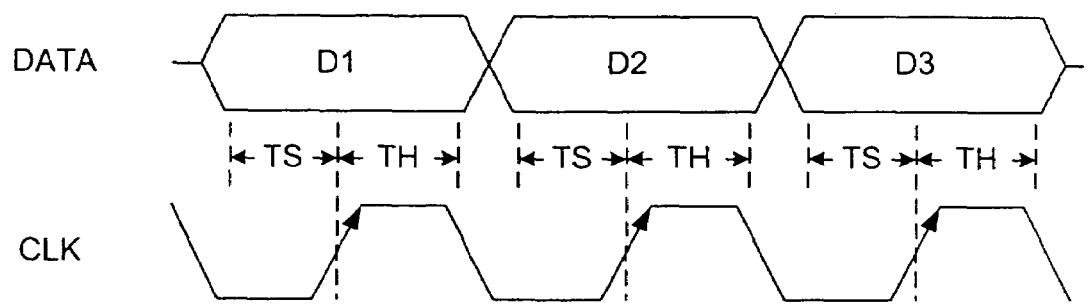
FIG. 1 (Prior Art) is a simplified waveform diagram illustrating three bus cycles.
Figure 2:
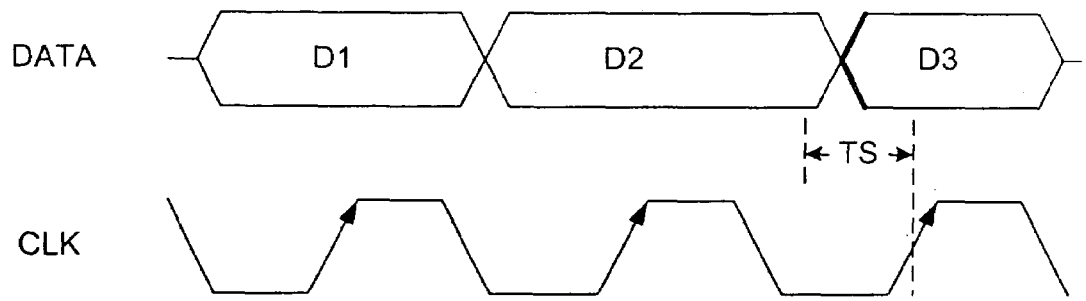
FIG. 2 (Prior Art) is a simplified waveform diagram illustrating a set up time problem caused by ground bounce.
Figure 3:
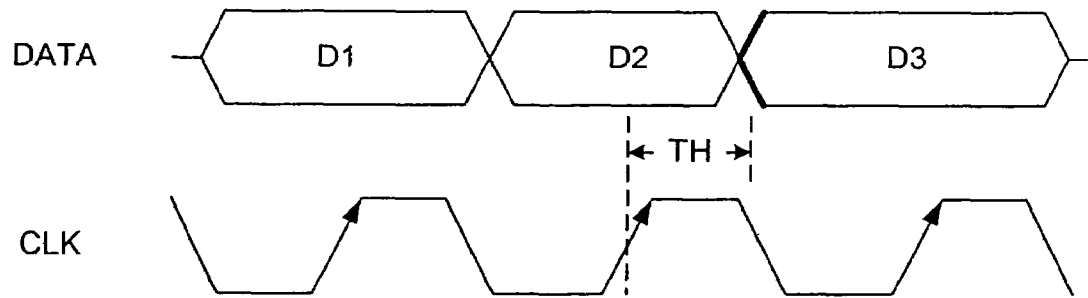
FIG. 3 (Prior Art) is a simplified waveform diagram illustrating a hold time problem.

Various timing adjustments may be made. For example, the timing of one or more of the lines carrying the signals from which the transitions are detected may be adjusted. Either alternatively or in conjunction with such adjustment, the timing of a line separate from the lines carrying the signals from which the transitions are detected may be adjusted. For example, the timing of a timing signal (e.g., a data strobe signal) used to recover information from the plurality of lines may be adjusted. Timing may be adjusted so as to indicate a point in time earlier or later than would otherwise be the case. As one technique for adjusting timing, delay may be added to a line or removed from a line to adjust timing. Another technique for adjusting timing would be to use a transmit clock signal that is earlier or later than the nominal transmit clock to clock out or drive a signal onto the bus. By appropriately increasing or decreasing delay, the problems illustrated in FIGS. 2 and 3 can be avoided. Thus, by varying timing relationships in response to patterns of transitions or logic levels, timing uncertainty at a receive circuit is effectively reduced.

Transitions detected from a given set of lines may be used to adjust the timing of that given set of lines or of fewer, more, or different lines. The adjustment may be applied equally to all of the lines being adjusted or may be applied differently. For example, the timing of lines exhibiting transitions may be adjusted, while lines not exhibiting transitions may be left unchanged. Different temporal amounts of adjustment may be applied among several lines. As another example, if the timing of a separate timing signal is being adjusted, the amount of the timing adjustment for that separate timing signal may be determined based on the transitions detected from several lines. In such a case, the amount of timing adjustment can be varied depending on the conditions of a number of lines. For example, the amount of the adjustment can be proportional to the number of lines exhibiting conditions from which transition-induced delay result. Contributions of individual lines to the transition-induced delay can be averaged, with the average used to adjust the timing of the separate timing signal or the timing of the lines themselves.

Consequently, by detecting transitions or other indicia of transition-induced delay and adjusting timing so as to meet timing requirements for successful recovery of information, transition-induced delay can be accommodated, thereby assuring accuracy in the recovery of information while allowing such recovery to occur in a minimal amount of time. Although the invention may be applied to any device or system exhibiting transition-induced delay, examples of devices and systems to which the invention may be applied include integrated circuit (IC) logic devices, application-specific integrated circuits (ASICs), programmable devices, such as field-programmable gate arrays (FPGAs), and memory devices and systems, such as synchronous dynamic random access memory (SDRAM) and double data rate (DDR) devices and systems. Embodiments of the invention may be applied at one or more levels of structure within a system. For example, an embodiment of the invention may be applied at an IC level to compensate for effects observed at that level (e.g., ground bounce and VDD droop), and an embodiment of the invention may be applied at a printed circuit (PC) board level to compensate for effects observed at that level (e.g., dielectric or capacitive interaction among signals carried by neighboring conductors).

According to one embodiment of the invention, in each output circuit, a programmable delay element is disposed in the data signal path to the output buffer of the output circuit. Logic in accordance with the invention detects whether each of the output buffers will switch at a given time. If the logic does not detect an upcoming simultaneous switching condition that would give rise to significant ground bounce, then the logic controls the programmable delay elements to have a first (larger) delay at that time. The overall circuit is designed to have proper setup and hold times in this situation. If, on the other hand, the logic detects an upcoming simultaneous switching condition, then the logic controls the programmable delay elements of each of the output circuits to have a second (smaller) delay at that time, thereby counteracting the delaying effect of the ground bounce and avoiding a setup time problem on the bus.

In some embodiments, the programmable delay elements in the output circuits have more than two selectable delays. The logic, after detecting each of the output buffers that will switch in a simultaneous switching condition, may use this information in different ways in different embodiments to combat problems associated with ground bounce slowing the output buffers. For example, the output buffer switching conditions that give rise to problems can be empirically determined by trying the various switching conditions and recording whether they gave rise to an output buffer slowing condition. The empirical analysis may be conducted as part of the design process such that the logic is implemented accordingly, or alternatively the logic on the integrated circuit can itself collect empirical information as the bus is running. While the bus is running, the logic can adjust how it controls the programmable delay elements for a given set of switching conditions in order to improve setup and/or hold times on the bus. As one example, the empirical analysis may occur during a calibration phase during or shortly after system startup. As another example, the empirical analysis may occur during system operation (e.g., at any time after system startup), for example to track temperature and voltage variation.

Other structures and method are disclosed in the detailed description below. This description does not purport to define the invention. The invention is defined by the claims.

Figure 4:
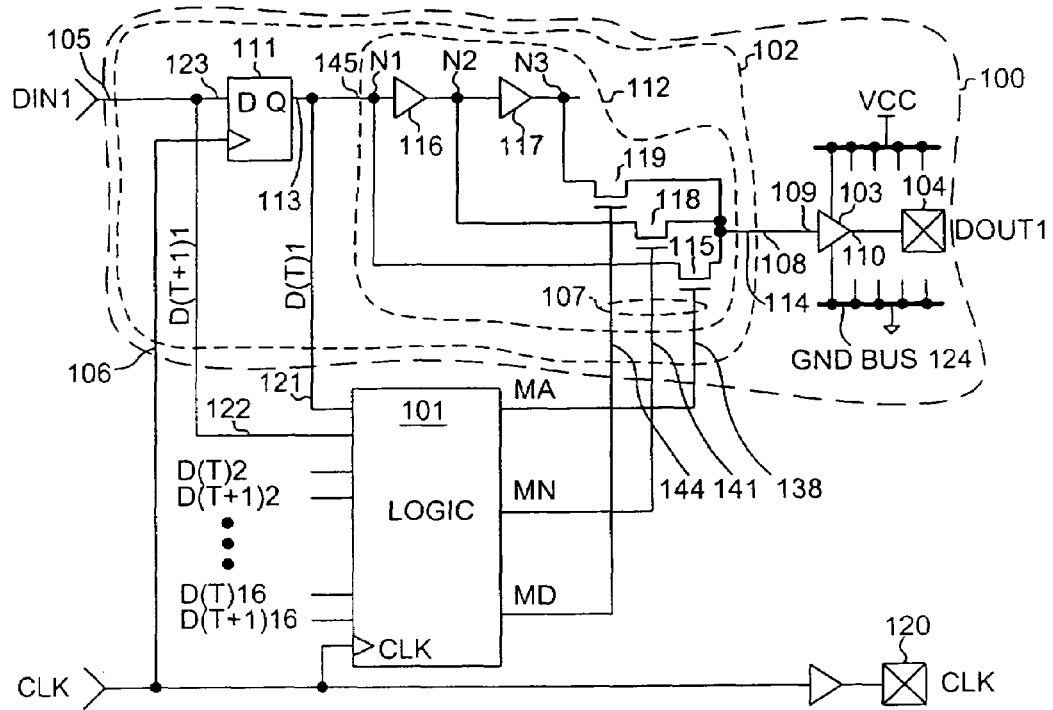
FIG. 4 is a simplified diagram of a circuit in accordance with an embodiment of the present invention.

FIG. 4 is a simplified diagram in accordance with one specific embodiment of the present invention. FIG. 4 illustrates an output circuit 100 and a logic block 101 disposed on an integrated circuit. There are, in this example, sixteen such output circuits. Each output circuit includes one bit of a sixteen bit register, an associated output buffer and an associated data terminal. Only one of the output circuits, output circuit 100, is illustrated here due to space limitations.

Exemplary output circuit 100 includes circuit block 102, output buffer 103, and data terminal 104. Circuit block 102 has a data input lead 105, a clock input lead 106, delay control input leads 107, and a data output lead 108. The data output lead 108 of circuit block 102 is coupled to an input lead 109 of output buffer 103. The output lead 110 of output buffer 103 is coupled to data terminal 104. Circuit block 102 in turn includes a sequential logic element 111 and a programmable delay element 112. The data output lead 113 of the sequential logic element 111 is coupled to the data input lead 145 of the programmable delay element 112.

The propagation delay from the data input lead 145 of the programmable delay element 102 to the data output lead 114 of the programmable delay element 112 can be varied by changing a three-bit digital delay control value (MA,MN,MD) present on the three delay control input leads 107. If, for example, the value (MA,MN,MD) is 100, then node N1 is coupled through transistor 115 to the output lead 114 of the programmable delay element. A signal output from sequential logic element 111 onto node N1 passes through transistor 115 without passing through either of delay elements 116 or 117.

If the value (MA,MN,MD) is 010, then node N2 is coupled through transistor 118 to output lead 114. A signal output from sequential logic element 111 onto node N1 passes through delay element 116 before passing onto node N2 and through transistor 118 to the output lead 114.

If the value (MA,MN,MD) is 001, then node N3 is coupled through transistor 119 to output lead 114. A signal output from sequential logic element 111 onto node N1 passes through delay elements 116 and 117 before passing onto node N3 and through transistor 119 to output lead 1114. Accordingly, it is seen that either none, one or two delay elements are coupled into the signal path from the output lead 113 of sequential logic element 111 to the input lead 109 of output buffer 103.

Output circuit 100 is fashioned such that in a typical bus cycle under normal switching conditions the data signal is supplied onto terminal 104 with proper set up time and hold time margins when the data signal passes through delay element 1116, to node N2, through transistor 118, and to output buffer 103. This typical situation corresponds to output buffer 103 being slowed an intermediate amount. This intermediate amount of slowing may, for example, be due to an amount of ground bounce caused by an intermediate number of output buffers of the register switching simultaneously.

If, on the other hand, the number of simultaneously switching output buffers is relatively small (smaller than the intermediate number), then the output buffer may be so fast that a potential hold time problem exists with the prior bus cycle. To avoid this situation, programmable delay element 112 is controlled to couple both the first and second delay elements 116 and 117 into the data signal path. Coupling the delay elements 116 and 117 into the signal path delays the switching of the data signal on output terminal 104 and helps or eliminates what would otherwise be a hold time problem.

If, on the other hand, the number of simultaneously switching output buffers is relatively large (larger than the intermediate number), then output buffer 103 may be so slow that a set up time problem with the present bus cycle exists. So much current is sunk by output buffers into ground bus 124 that the voltage on ground bus 124 rises momentarily thereby slowing some or all of the output buffers, for example, the output buffers pulling their outputs to a low logic level. Depending on the routing of ground bus 124 and the sensitivity of the output buffers to this phenomenon, other output buffers besides those pulling their outputs low may also be affected or only a certain output buffers may be affected. For example, ground bus 124 may include a mesh of connectors (such as a single pin or multiple pins) and/or conductors. This mesh has finite resistivity and is capable of carrying a finite current, thereby resulting in an IR (current times resistance) drop (often referred to as "voltage drop") affecting the voltage of ground bus 124. Also, a change in current flow through inductive ground pins coupled to ground bus 124 can induce a voltage as a function of $$L\frac{di}{dt}$$

(the inductance times the time rate of change of the current), thereby resulting in ground bounce. To avoid this situation, programmable delay element 112 is controlled such that neither of the delay elements 116 and 117 is coupled into the data signal path. This advances the switching of the data signal on output terminal 104 with respect to the clock signal on clock terminal 120, thereby helping or eliminating what would otherwise be a set up time problem.

Logic block 101 detects whether the data signal value for each of the sixteen register bits will switch, and based on that information determines whether to couple two delay elements 116 and 117 into the data signal path, whether to couple only one delay element 116 into the data signal path, or whether to couple neither of delay elements 116 and 117 into the data signal path. Logic block 101 has an input lead 121 coupled to the output lead 113 of sequential logic element 111. The value on this lead 121 is the logic value from which the data signal will switch if it switches after the next rising edge of the clock signal CLK. Logic block 101 also has an input lead 122 coupled to the data input lead 123 of sequential logic element 111. The value on this lead 122 is the logic value to which the data signal will switch if it switches. Logic block 101 has two input leads like 121 and 122 for each of the other bits of the register.

Figure 5:
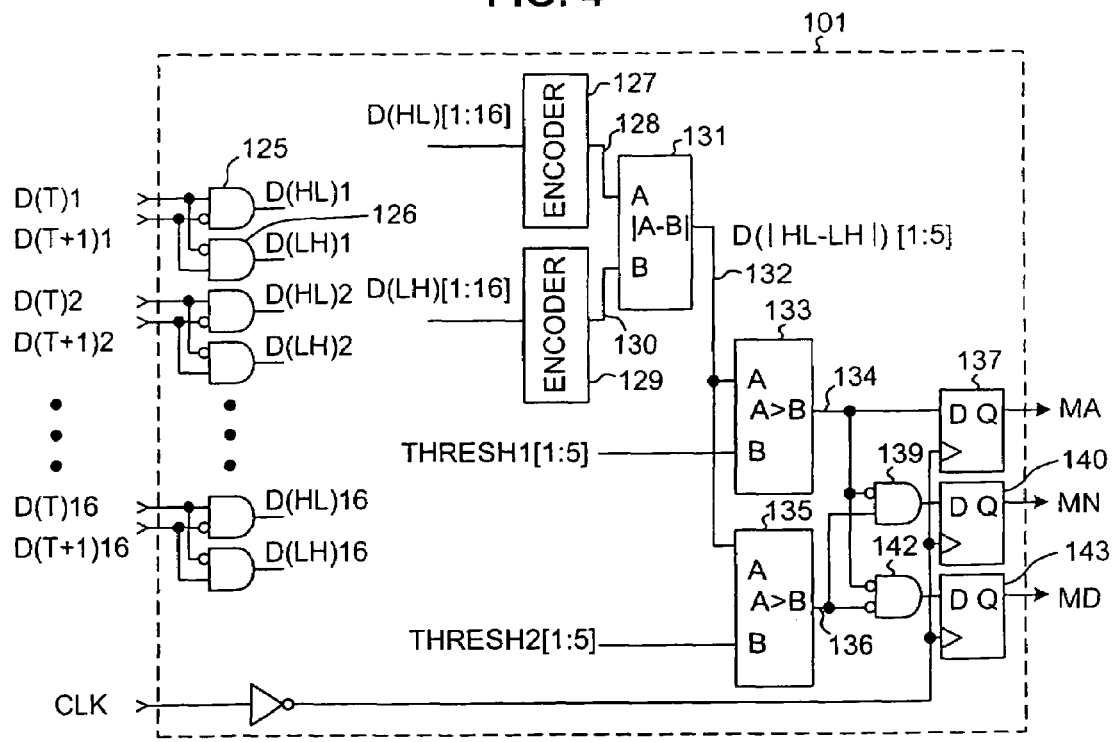
FIG. 5 is a more detailed diagram of one possible implementation of logic block 101 of FIG. 4.

FIG. 5 is a more detailed diagram of one possible implementation of logic block 101. AND gate 125 detects whether the data signal for the first bit will switch from high to low and outputs the signal D(HL)1 indicative of whether the first bit will switch from high to low. AND gate 126 detects whether the data signal for the first bit will switch from low to high and outputs the signal D(LH)1 indicative of whether the first bit will switch from low to high. There are similar pairs of AND gates for each of the other sixteen bits of the register.

An encoder 127 receives as inputs the output signals D(HL)[1:16] from the gates that detect if their corresponding bits will transition from high to low. Encoder 127 encodes the number of these output signals D(HL)[1:16] into a four-bit value and outputs that four-bit value onto lines 128. Similarly, an encoder 129 receives as inputs the output signals D(LH)[1:16] from the gates that detect if their corresponding bits will transition from low to high. Encoder 129 encodes the number of these output signals D(LH)[1:16] into a four-bit value and outputs that four-bit value onto lines 130. In this particular embodiment, logic element 131 determines the absolute value of the difference between the number of bits that will switch from high to low and the number of bits that will switch from low to high. The result is a five bit value D(|HL-LH|)[1:5] that is output by logic element 131 onto lines 132.

Comparator 133 compares this number D(|HL-LH|)[1:5] with a first threshold value THRES1[1:5] and outputs a value onto output lead 134 indicative of whether number D(|HL-LH|)[1:5] is greater than the first threshold value THRES1[1:5]. Comparator 135 compares this number D(|HL-LH|)[1:5] with a second threshold value THRES2[1:5] and outputs a value onto output lead 136 indicative of whether number D(|HL-LH|)[1:5] is greater than the second threshold value THRES2[1:5]. The first threshold value THRESH1[1:5] is greater than the second threshold value THRESH[1:5].

If the number of switching bits as indicated by D(|HL-LH|)[1:5] is greater than the largest threshold value THRES1[1:5], then the data signal is to go through neither of delay elements 116 and 117. The value (MA,MN,MD) is 100. The signal output from comparator 133 is therefore supplied via flip-flop 137 to the MA input lead 138 of programmable delay element 112.

If the number of switching bits as indicated by D(|HL-LH|)[1:5] is greater than the smaller of the threshold values THRES2[1:5] but is not greater than the larger of the two threshold values THRES1[1:5], then the data signal is to go through only one of the delay elements, delay element 116. AND gate 139 detects this situation. The signal output from AND gate 139 is therefore supplied via flip-flop 140 to the MN input lead 141 of programmable delay element 112. The value (MA,MN,MD) is 010.

If the number of switching bits as indicated by D(|HL-LH|)[1:5] is neither greater than threshold value THRES1[1:5] nor THRES2[1:5], then the data signal is to go through both of the two delay elements 116 and 117. AND gate 142 detects this situation. The signal output from AND gate 142 is therefore supplied via flip-flop 143 to the MD input lead 144 of programmable delay element 112. The value (MA, MN,MD) is 001.

While logic element 131 is described as determining the absolute value of the difference between the number of bits that will switch from high to low and the number of bits that will switch from low to high, it should be understood that other embodiments of logic element 131 may be practiced to accommodate characteristics of particular systems in which the invention may be used. For example, the absolute value of the difference described above is especially useful in systems where supply voltage (e.g., VDD) and ground pins are tightly coupled. Such tight coupling exists where currents associated with high-to-low and low-to-high switching, which flow in opposite directions, reduce the effective inductance of the inductive loop formed between the supply voltage and ground pins, allowing the effects of a high-to-low transition and a low-to-high transition to substantially cancel out each other.

However, in cases where the supply voltage and ground pins are not so tightly coupled, it is useful to determine other relationships between the number of bits that will switch from high to low and the number of bits that will switch from low to high. For example, where there is no substantial interaction between currents to reduce the effective inductance of the inductive loop, the effects of opposite transitions do not substantially cancel out each other, so the difference between opposite transitions is not as meaningful. Rather, it is useful to consider high-to-low transitions and low-to-high transitions to have additive effects. Thus, under some circumstances, it is useful to determine the sum of the number of high-to-low transitions and the number of low-to-high transitions and to use that sum in place of the absolute value of the difference described above.

It is also possible to have situations where both additive and subtractive effects occur, for example, where some pins are tightly coupled, while others are not. Thus, it can be useful to determine a more complex relationship between the number of high-to-low transitions and the number of low-to-high transitions. Such a more complex relationship can take into consideration individual relationships between different pins. For example, proximities of pins to one another and their influences on each other can be considered. As an example, a first pin may be considered to be tightly coupled to a second pin, but not tightly coupled to a third pin, and these individual relationships can be considered to determine the effects of transitions involving those pins. Since the effects of some individual relationships of pins may tend to be additive, while the effects of others may tend to be subtractive, the sum of the numbers of some transitions may be combined with the absolute value of the difference of other transitions to yield a more meaningful result that can be used to control the timing of signals.

Although one example of logic block 101 is illustrated in FIG. 5, it is to be understood that many other examples can be implemented. Information that an output buffer will switch can be used in many different ways by logic block 101 to combat deleterious effects of simultaneous switching. The impact of simultaneous switching on particular output buffers generally depends on the physical layout of those particular output buffers, on the physical characteristics and layout of the ground bus coupled to the output buffers, and on numerous other characteristics of the particular output circuit layout. The signals MA, MN, MD that control the programmable delay elements of the output circuits therefore are appropriately generated from the signals D(T)1[1:16] and/or D(T+1)[1:16] in different ways in different embodiments. In one embodiment, logic block 101 is realized using a look-up table. The values D(T)[1:16] and D(T+1)[1:16] are used to address the look-up table. The addressed locations in the look-up table contain the output values MA, MN and MD. Other methods of lookup are usable as well. The translation from D(T)[1:16] and D(T+1)[1:16] to output values MA, MN and MD can be analyzed using logic equations and carried out using random logic. Similarly, programmable delay elements other than the particular one illustrated in FIG. 4 can be used. The propagation delay of the data signal path to the input lead of the output buffer can be increased without coupling delay elements into the data signal path. The speed of circuitry in the signal path can be altered. The supply voltage provided to a logic element in the signal path can be manipulated to change the speed of the logic element and therefore the propagation delay to the input lead of the output buffer.

Figure 6:
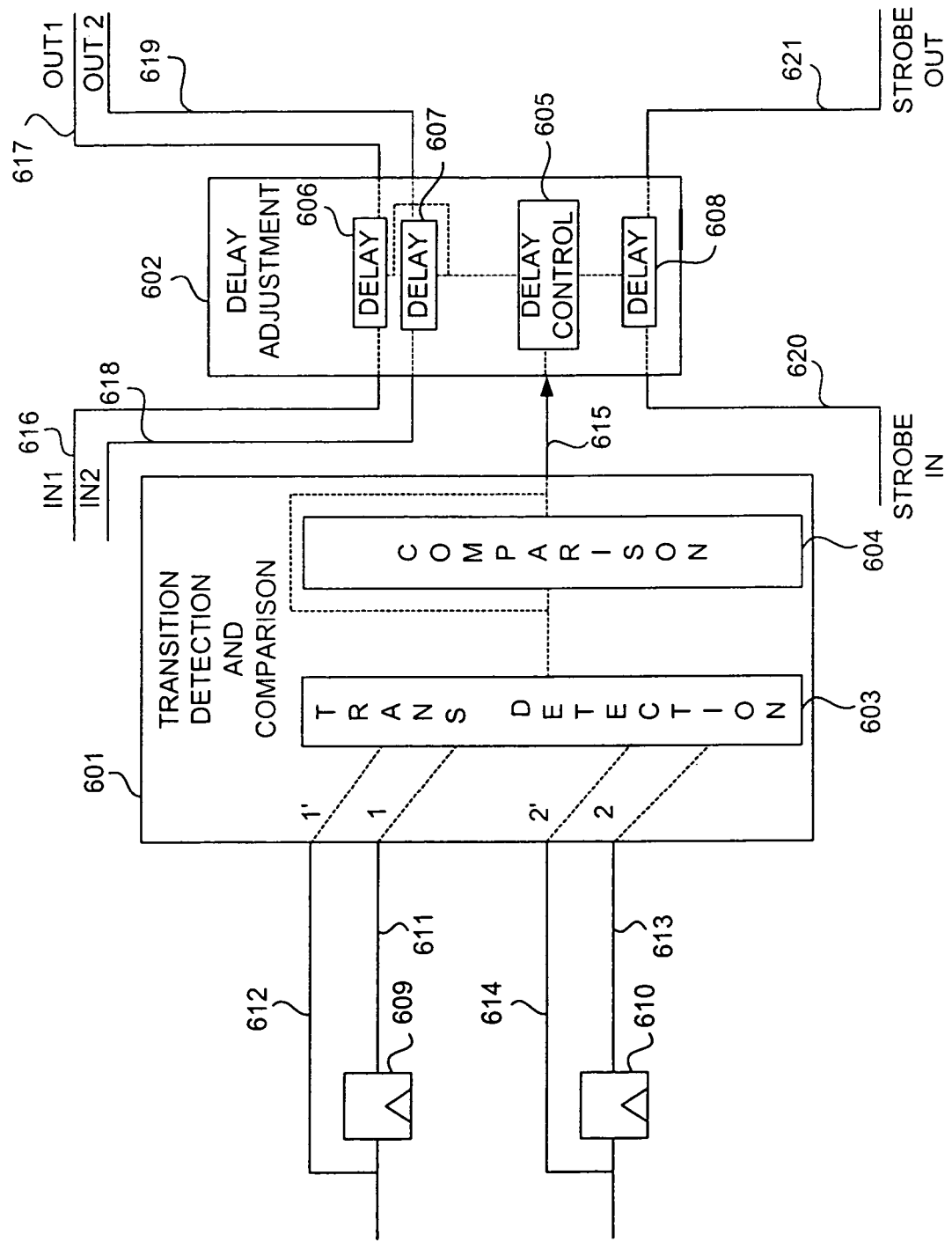
FIG. 6 is a block diagram illustrating an apparatus in accordance with an embodiment of the present invention.

FIG. 6 is a block diagram illustrating an apparatus in accordance with an embodiment of the present invention. Transition detection and comparison block 601 includes transition detection block 603 and comparison block 604. A plurality of lines are coupled to inputs of transition detection block 603 of transition detection and comparison block 601. Line 611 provides a first line current logic state to transition detection block 603. Line 612 provides a first line next logic state to transition detection block 603. Line 613 provides a second line current logic state to transition detection block 603. Line 614 provides a second line next logic state to transition detection block 603. While D flip-flop 609 is shown to illustrate the temporal relationship of lines 611 and 612 and D flip-flop 610 is shown to illustrate the temporal relationship between lines 613 and 614, other techniques for detecting transitions of lines may be used. While a transition may be detected by comparing the state of a line prior to the time at which the transition would occur to the state of the line at a time after the transition would occur, other characteristics of a transition may be used to detect its presence. For example, a detection circuit may be AC coupled to a line and observe transient effects of the transition passed through the AC coupling. As another example, the flow of current resulting from the transition may be sensed to detect a transition. These techniques may also be used to differentiate between rising and falling transitions. Information indicative of transitions occurring on lines coupled to inputs of transition detection block 603 is passed to comparison block 604 of transition detection and comparison block 601 or, alternatively, to delay control block 605 of delay adjustment block 602.

Delay adjustment block 602 includes delay control block 605 and delay elements 606, 607, and 608. Comparison block 604 compares the information from transition detection block 603 indicative of transitions occurring on the lines coupled to the inputs of transition detection block 603. In one embodiment, comparison block 604 compares the number of rising transitions among the plurality of lines to the number of falling transitions among the plurality of lines. In one embodiment, comparison block 604 provides an output 615 to delay control block 605 of delay adjustment block 602 that corresponds to an absolute value of the difference between the number of rising transitions and the number of falling transitions. In another embodiment, which is especially useful when rising transitions and falling transitions result in differing amounts of transition induced delay, comparison block 604 provides an output 615 to delay control block 605 indicating both the number of rising transitions and the number of falling transitions, thereby allowing delay control block 605 to control delay based on the effect of both the rising transitions and the falling transitions. In yet another embodiment, comparison block 604 provides output 615 to delay control block 605, indicating the difference between the number of rising transitions and the number of falling transitions as well as indicating the relative prevalence of the rising transitions and falling transitions.

Delay control block 605 controls the amounts of delay introduced by delay elements 606, 607, and 608 of delay adjustment block 602. A first input line 616 is coupled to an input of delay element 606. A first output line 617 is coupled to an output of delay element 606. A second input line 618 is coupled to an input of delay element 607. A second output line 619 is coupled to an output of delay element 607. In one embodiment, input line 616 may be coupled to the first input to transition detection block 603 and second input line 618 may be coupled to the second line coupled to the input of transition detection block 603. Strobe input line 620 is coupled to an input of delay element 608. Strobe output line 621 is coupled to an output of delay element 608. Delay control block 605 may cause adjustment of the delay introduced by any or all of delay element 606, 607, and 608. For example, delay control block 605 may increase or decrease the amount of delay provided by either or both of delay element 606 and 607. Either alternatively or in conjunction with the delay provided by delay elements 606 and 607, delay control block 605 can increase or decrease the amount of delay provided by delay element 608. For example, delay control block 605 may increase the amount of delay provided by delay elements 606 and 607, while decreasing the amount of delay provided by delay element 608.

In one embodiment of the invention, output 615 provides a digital value to delay control block 605. Delay control block 605 includes a digital-to-analog converter (DAC). The DAC provides an analog control voltage to a delay element, for example, delay element 608, to control an amount of delay provided by the delay element.

Figure 7:
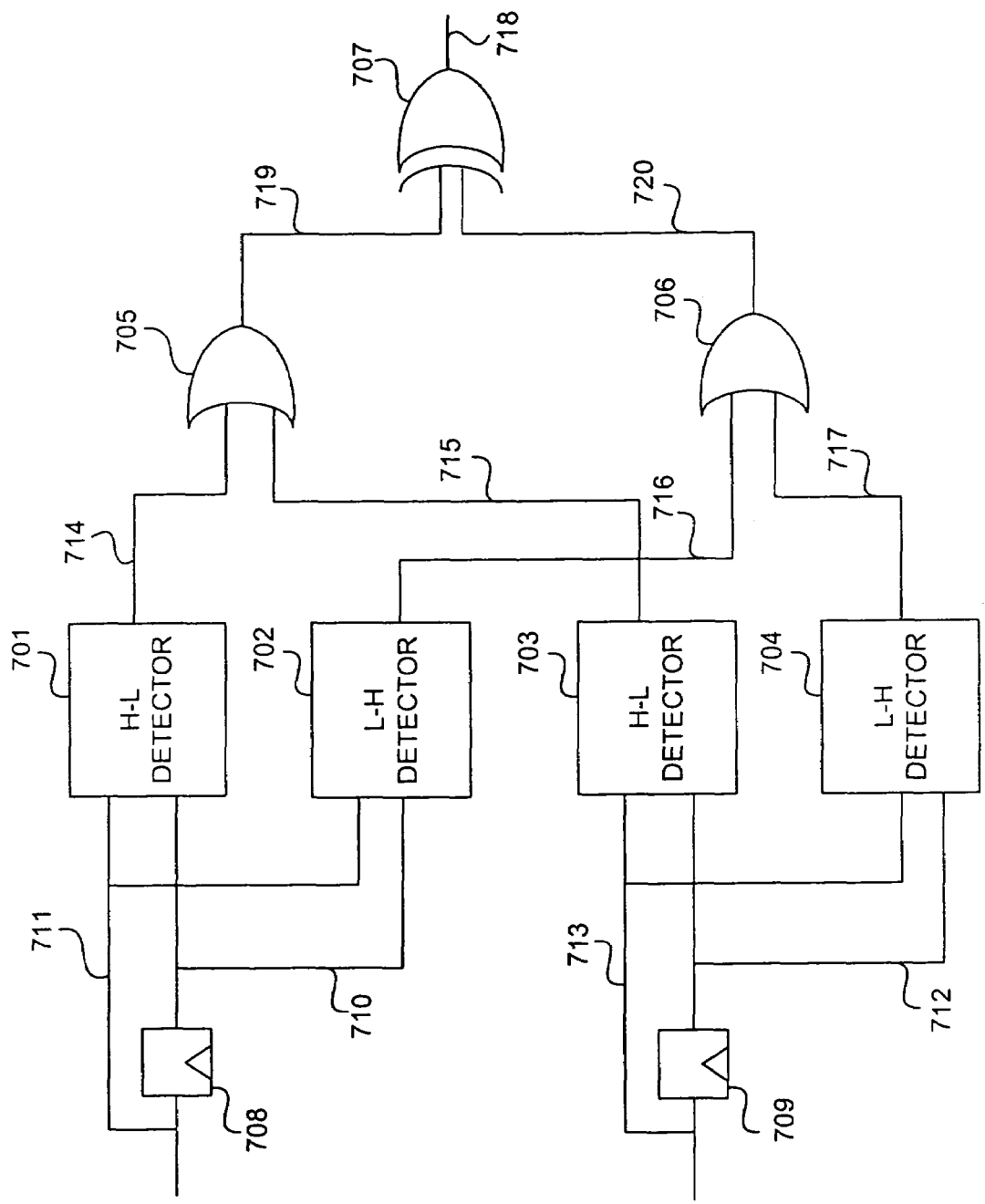
FIG. 7 is a logic diagram illustrating an apparatus for accommodating transition-induced delay in accordance with an embodiment of the present invention.

FIG. 7 is a logic diagram illustrating an apparatus for accommodating transition-induced delay in accordance with an embodiment of the present invention. A line 710 providing a first line current logic state is coupled to an input of high-to-low transition detector 701 and to an input to low-to-high transition detector 702. A line 711 providing a first line next logic state is coupled to an input of high-to-low-transition detector 701 and to an input of low-to-high transition detector 702. A line 712 providing a second line current logic state is coupled to an input of high-to-low transition detector 703 and to an input of low-to-high transition detector 704. A line 713 providing a second line next logic state is coupled to an input of high-to-low transition detectors 703 and to an input of low-to-high transition detector 704. While D flip-flop 708 is illustrated as having line 711 coupled to its input and line 710 coupled to its output and D flip-flop 709 is illustrated as having line 713 coupled to its input and line 712 coupled to its output, D flip-flops 708 and 709 are illustrated merely to help show the temporal relationship between the lines coupled to their respective inputs and outputs. It should be understood that other techniques for obtaining the first line current and next logic states and the second line current and next logic states may be used. As an example, a first line and a second line may be sampled at different times to obtain their respective current and next logic states, and those current and next logic states may be provided to the respective high-to-low and low-to-high transition detectors. Alternatively, other techniques, for example, either those known in the art or those described elsewhere herein may be used.

High-to-low transition detector 701 detects a high-to-low logic transition based on its inputs and provides an output 714. Low-to-high transition detector 702 detects a low-to-high logic transition based on its inputs and provides an output 716. High-to-low transition detector 703 detects a high-to-low transition based on its inputs and provides an output 715. Low-to-high transition detector 704 detects a low-to-high logic transition based on its inputs and provides an output 717. Output 714 and output 715 are coupled to inputs of OR gate 705. Outputs 716 and 717 are coupled to inputs of OR gate 706. OR gate 705 provides output 719 to an input of XOR (exclusive OR) gate 707. OR gate 706 provides an output 720 to an input of XOR gate 707. XOR gate 707 provides an output 718.

The logic illustrated in FIG. 7 conforms to the following truth table:

|    | HH | HL | LH | LL |
|----|----|----|----|----|
| HH | 0  | 1  | 1  | 0  |
| HL | 1  | 1  | 0  | 1  |
| LH | 1  | 0  | 1  | 1  |
| LL | 0  | 1  | 1  | 0  | wherein the horizontal axis corresponds to the states of line 710 and line 711 and the vertical axis corresponds to the states of line 712 and 713. HH indicates an unchanged high logic level from the current logic state to the next logic state. HL indicates a transition from a high logic level in the current logic state to a low logic level in the next logic state. LH indicates a transition from a low logic level in the current logic state to a high logic level in the next logic state. LL indicates an unchanged low logic level from the current logic state to the next logic state.

It should be understood that the terms high logic level and low logic level are intended to denote different logic levels, for example, a first logic level and a second logic level. The first and second logic levels may include any different logic levels, for example, different logic levels used in binary signaling or different logic levels among several logic levels used in multi-level signaling. For example, an embodiment of the invention may be applied to a system having more than two logic levels, for example, a system having four logic levels.

In one embodiment of the invention, output 718 may be used to control a delay element or to otherwise control the adjustment of the timing of a signal. Alternatively, several instances of the apparatus illustrated in FIG. 7 may be used, with each instance coupled to its own lines. The several instances of output 718 may be compared and used to determine the appropriate timing adjustment. For example, the amount of timing adjustment can be determined based on the number of the instances of output 718 indicating a need for timing adjustment. In one embodiment, the timing adjustment is proportional to the number of instances of output 718 indicating the need for timing adjustment.

Alternatively, the several instances of outputs 719 and 720 may be compared and used to determine the appropriate timing adjustment. For example, timing adjustment to accommodate transition-induced delay from high-to-low transitions can be performed based on subtracting the number of instances of output 720 having a true logic state from the number of instances of output 719 having a true logic state. As another example, timing adjustment to accommodate transition-induced delay from low-to-high transitions can be performed based on subtracting the number of instances of output 719 having a true logic state from the number of instances of output 720 having a true logic state.

As another alternative, the several instances of outputs 714-717 may be compared and used to determine the appropriate timing adjustment. For example, timing adjustment to accommodate transition-induced delay from high-to-low transitions can be performed based on subtracting the number of instances of output 716 having a true logic state added to the number of instances of output 717 having a true logic state from the number of instances of output 714 having a true logic state added to the number of instances of output 715 having a true logic state. As another example, timing adjustment to accommodate transition-induced delay from low-to-high transitions can be performed based on subtracting the number of instances of output 714 having a true logic state added to the number of instances of output 715 having a true logic state from the number of instances of output 716 having a true logic state added to the number of instances of output 717 having a true logic state.

Figure 8:
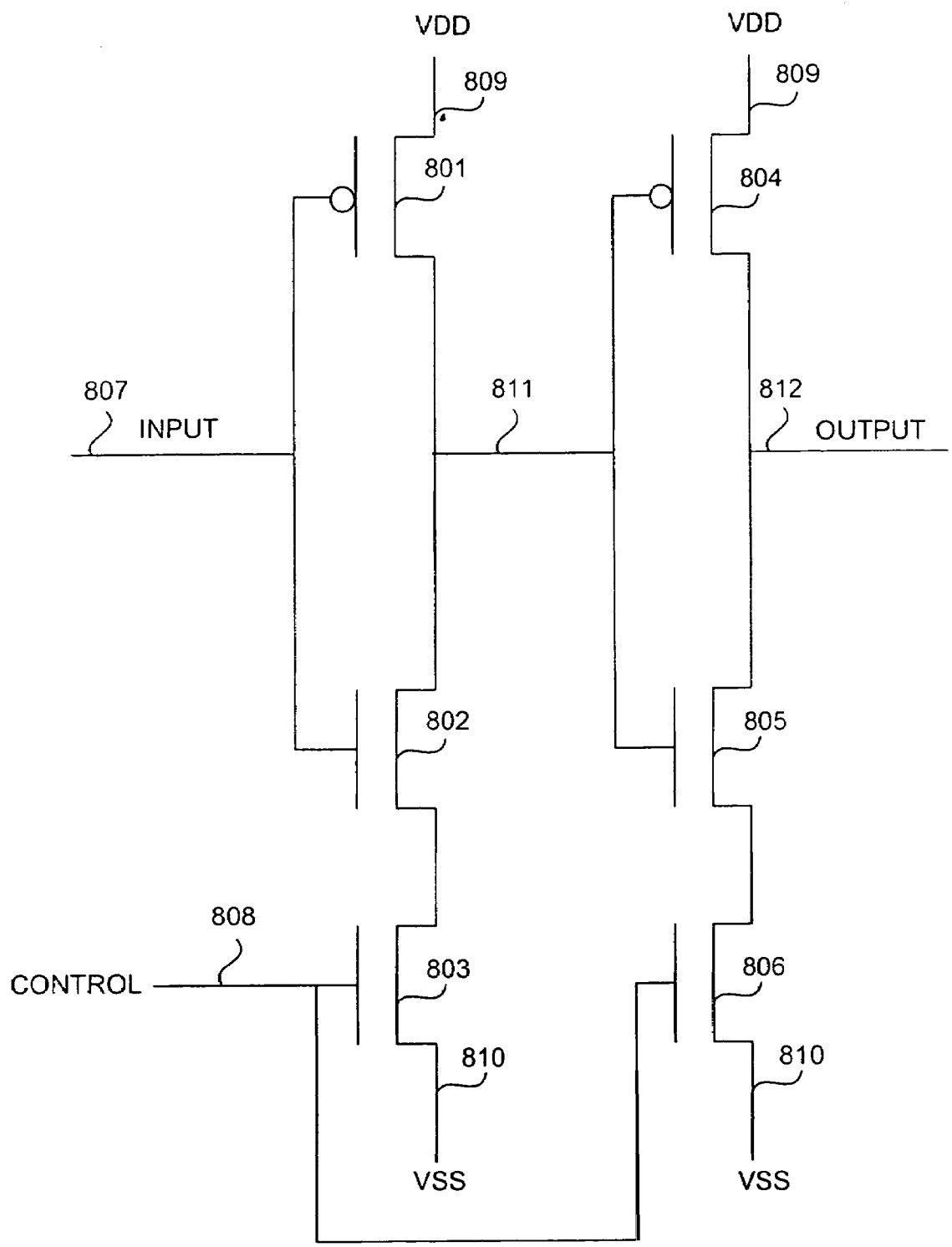
FIG. 8 is a schematic diagram illustrating a circuit for implementing a delay element in accordance with an embodiment of the present invention.

FIG. 8 is a schematic diagram illustrating a circuit for implementing a delay element in accordance with an embodiment of the present invention. Input 807 is coupled to a gate terminal of p-channel metal oxide semiconductor (PMOS) transistor 801 and a gate terminal of n-channel metal oxide semiconductor (NMOS) transistor 802. Supply voltage VDD is present at node 809, which is coupled to a source terminal of PMOS transistor 801. A drain terminal of PMOS transistor 801 is coupled to node 811, which is coupled to a drain terminal of transistor 802, a gate terminal of PMOS transistor 804, and a gate terminal of NMOS transistor 805. A source terminal of NMOS transistor 802 is coupled to a drain terminal of NMOS transistor 803. A source terminal of NMOS transistor 803 is coupled to node 810, which is coupled to supply voltage VSS. A control voltage is provided at node 808, which is coupled to a gate terminal of NMOS transistor 803 and to a gate terminal of NMOS transistor 806. Node 809 is also coupled to a source terminal of PMOS transistor 804. A drain terminal of PMOS transistor 804 is coupled to node 812 which provides an output and is also coupled to a drain terminal of NMOS transistor 805. A source terminal of NMOS transistor 805 is coupled to a drain terminal of NMOS transistor 806. A source terminal of NMOS transistor 806 is coupled to node 810. It should be understood that supply voltage VDD and supply voltage VSS may be described with reference to other well known terms used to denote positive supply voltages, negative supply voltages, and/or grounds voltages. For example, supply voltage VSS may be coupled to ground and supply voltage VDD may be coupled to a supply voltage having a different nomenclature, for example, VCC.

A control voltage applied at node 808 can be used to control current through NMOS transistors 803 and 806, thereby controlling current through PMOS transistors 801 and 804 and NMOS transistors 802 and 805. By controlling the current, the switching speed of the circuit may be controlled. By controlling the switching speed, a variable delay between node 807 and node 812 can be controlled. Selective control of the variable delay between node 807 and node 812, wherein different amounts of delay may be provided for rising transitions and falling transitions, may be provided by providing separate control voltages to the gate terminal of NMOS transistors 803 and 806.

Figure 9:
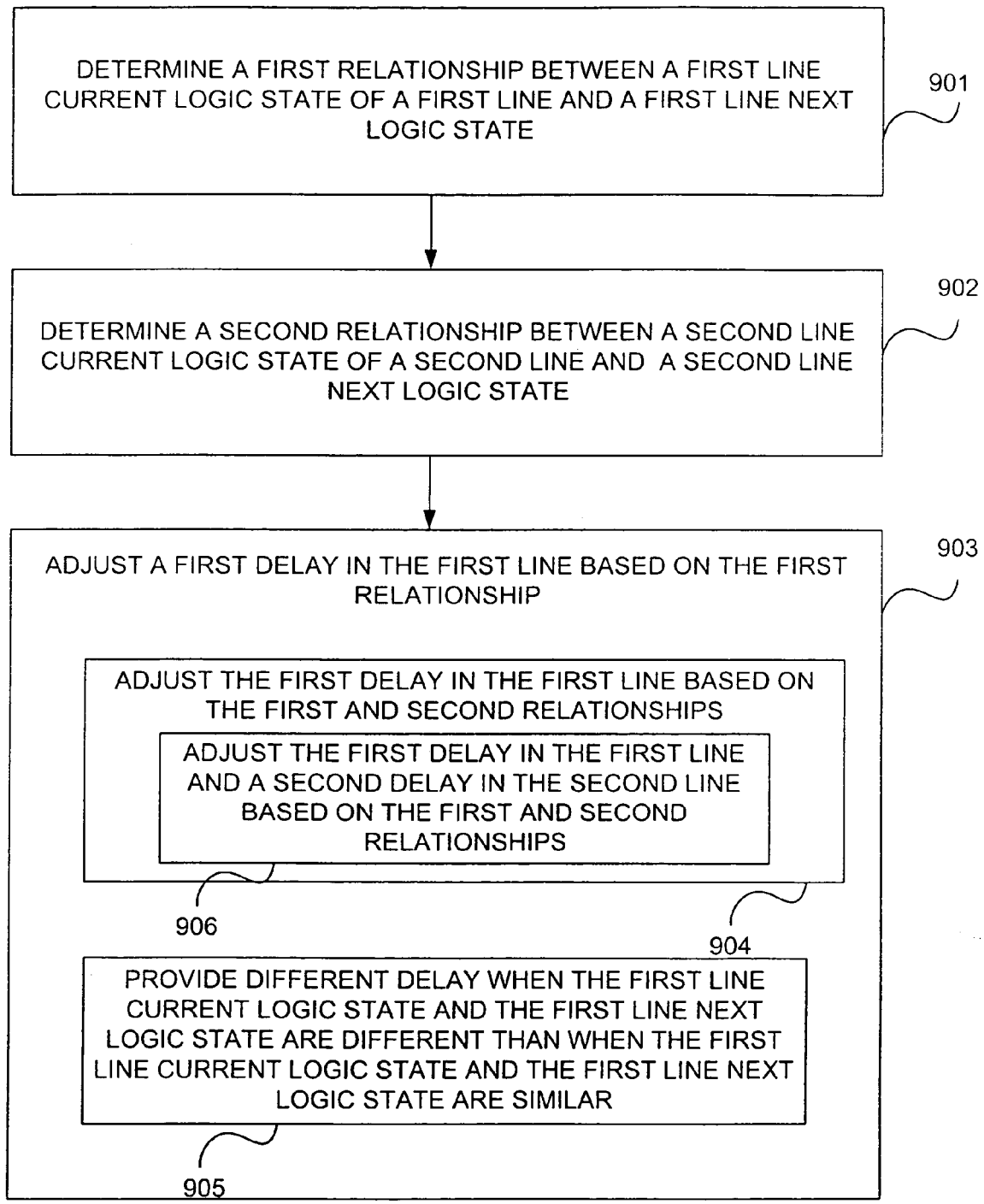
FIG. 9 is a flow diagram illustrating a method for accommodating transition-induced delay in accordance with an embodiment of the present invention.

FIG. 9 is a flow diagram illustrating a method for accommodating transition-induced delay in accordance with an embodiment of the present invention. In step 901, a first relationship between a first line current logic state of a first line and a first line next logic state is determined. In step 902, a second relationship between a second line current logic state of a second line and a second line next logic state is determined. The first relationship and the second relationship can be determined based on detecting transitions or the lack of transitions on a first line and a second line. In step 903, a first delay in the first line is adjusted based on the first relationship. Step 903 may include step 904. In step 904, the first delay in the first line is adjusted based on the first and second relationships. Step 904 may include step 906. In step 906, the first delay in the first line and the second delay in the second line are adjusted based on the first and second relationships. Step 903 may include step 905. In step 905, different delay is provided when the first line current logic state and the first line next logic state are different than when the first line current logic state and the first line next logic state are similar.

It should be understood that the first delay and the second delay may provide equal amounts of delay or different amounts of delay. It should also be understood that the first delay may be adjusted by itself or in conjunction with adjustment of the second delay. If the first delay and the second delay are both adjusted, they may be adjusted similarly or independently of one another.

Figure 10:
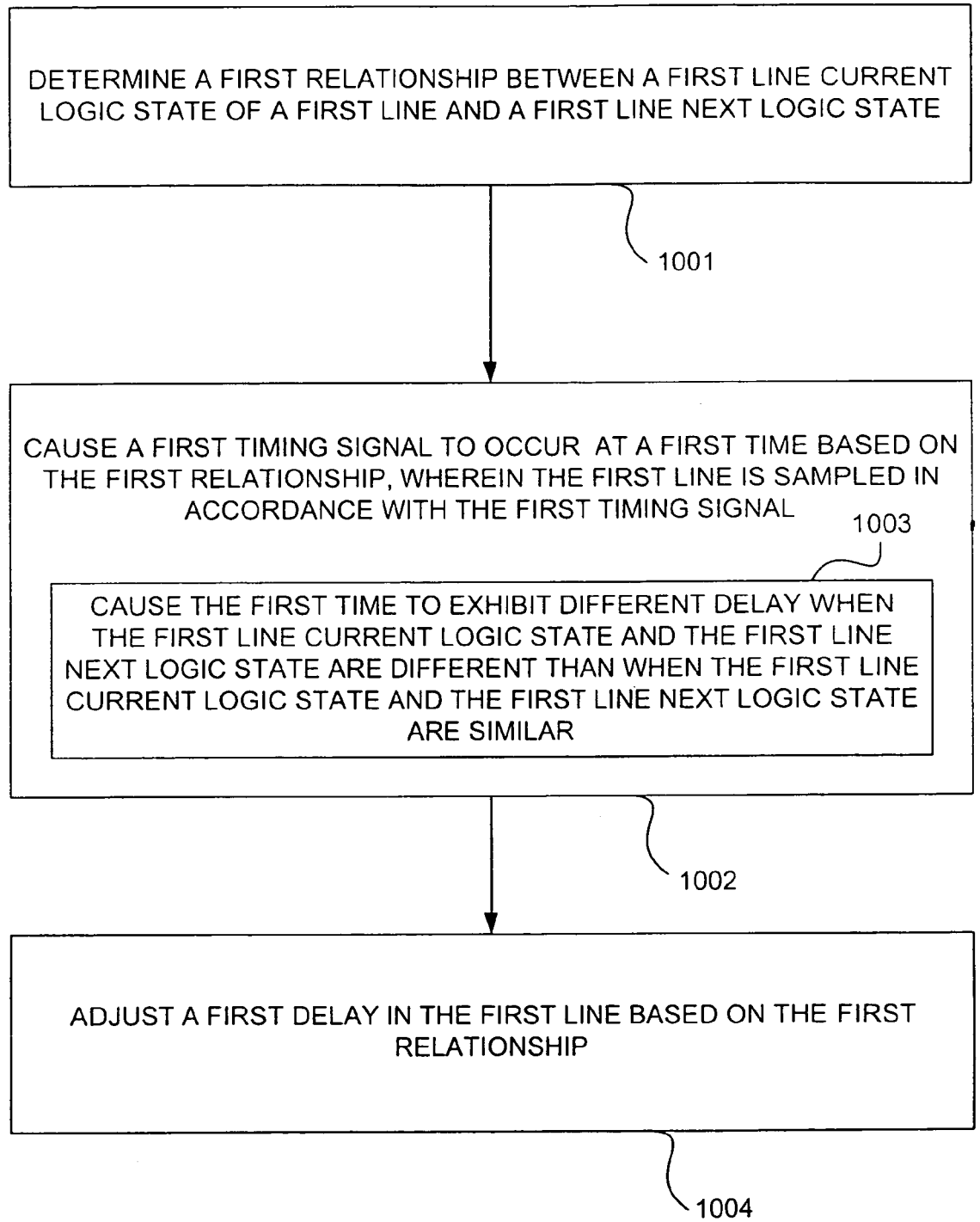
FIG. 10 is a flow diagram illustrating a method for accommodating transition-induced delay in accordance with an embodiment of the present invention.

FIG. 10 is a flow diagram illustrating a method for accommodating transition-induced delay in accordance with an embodiment of the present invention. In step 1001, a first relationship between a first line current logic state of a first line and a first line next logic state of the first line is determined. In step 1002, a first timing signal is caused to occur at a first time based on the first relationship. The first line is sampled in accordance with the first timing signal. Step 1002 may include step 1003. In step 1003, the first time is caused to exhibit different delay when the first line current logic state and the first line next logic state are different than when the first line current logic state and the first line next logic state are similar. In step 1004, a first delay in the first line is adjusted based on the first relationship.

Figure 11:
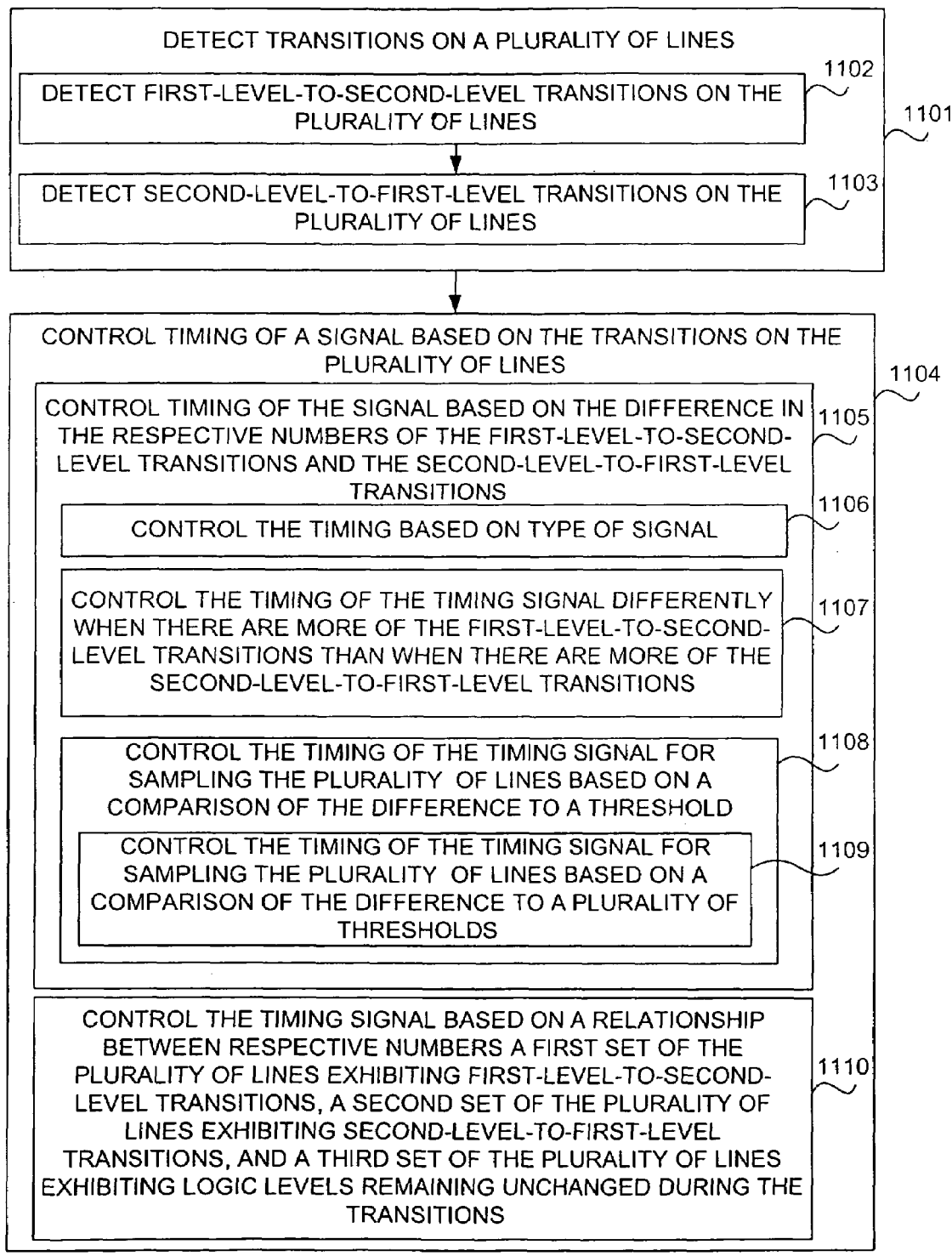
FIG. 11 is a flow diagram illustrating a method for accommodating transition-induced delay in accordance with an embodiment of the present invention.

FIG. 11 is a flow diagram illustrating a method for accommodating transition-induced delay in accordance with an embodiment of the present invention. In step 1101, transitions are detected on a plurality of lines. Step 1101 may include steps 1102 and 1103. In step 1102, first-level-to-second-level transitions are detected on the plurality of lines. In step 1103, second-level-to-first-level transitions are detected on the plurality of lines. In step 1104, a timing of a signal is controlled based on the transitions on the plurality of lines. The signal may be among the signals carried by the plurality of lines or it may be a separate signal, for example, a timing signal. Step 1104 may include step 1105. In step 1105, the timing is controlled based on a difference in respective numbers of the first-level-to-second-level transitions and the second-level-to-first-level transitions. Such a difference need not necessarily be limited to difference such as the absolute value of the number of second-level-to-first-level transitions subtracted from the number of first-level-to-second-level transitions (e.g., |LH-HL|), but the difference may be identified based on some mathematical function involving the respective numbers of the first-level-to-second-level transitions and the second-level-to-first-level transitions. Thus, the timing is controlled based on some mathematical function relating to the respective numbers of the first-level-to-second-level transitions and the second-level-to-first-level transitions. Step 1105 may include steps 1106, 1107, and/or 1108. In step 1106, the timing may be controlled based on the type of signal. For example, if the timing of a signal carried by one of the plurality of lines is controlled, the timing of the signal is controlled such that the signal is delayed with a delay that is increased when the difference in the respective numbers of the first-level-to-second-level transitions and the second-level-to-first-level transitions is decreased. As another example, if the timing of a timing signal used to indicate when information is to be recovered from the plurality of lines is controlled, the timing of the timing signal is delayed when the difference in the respective numbers of the first-level-to-second-level transitions and the second-level-to-first-level transitions is increased.

In one embodiment, both the timing of a timing signal used to indicate when information is to be recovered from the plurality of lines (e.g. a data strobe signal) and the timing of one or more signals on one or more of the plurality of lines (e.g., one or more data lines) are adjusted. For example, if a data strobe signal would otherwise occur too early relative to the presence of valid data on data lines, the timing of the data lines is adjusted to allow the valid data to occur earlier, and the timing of the data strobe signal is adjusted to cause the data strobe signal to occur later, thereby allowing the data strobe signal to occur while valid data is present on the data lines. Such a technique avoids the need for large amounts of adjustment to the timing of either of the data signals or the data strobe signals by allowing the timing of both of the data signals and the data strobe signals to be adjusted to a lesser extent.

In step 1107, the timing is controlled differently when there are more of the first-level-to-second-level transitions than when there are more of the second-level-to-first-level transitions. For example, in a system where transition-induced delay is more sensitive to high-to-low transitions than low-to-high transitions, a larger adjustment of timing may be made for a given number of high-to-low transitions than for a similar number of low-to-high transitions. In such a system, a similar adjustment of timing may be made for a given number of high-to-low transitions or for a larger number of low-to-high transitions. To provide a numerical example, in a system twice as sensitive in terms of transition-induced delay to high-to-low transitions as to low-to-high transitions, one temporal unit of timing adjustment is made for three high-to-low transitions or for six low-to-high transitions. This may be understood alternatively as providing one temporal unit of adjustment for every six low-to-high transitions and two temporal units of adjustment for every six high-to-low transitions.

The respective numbers of different types of transitions may be considered so as to take into account the extent to which one type of transition cancels out another. For example, if each low-to-high transition occurring at the same time as a high-to-low transition effectively cancels out half of the transition-induced delay caused by the high-to-low transition, the amount of timing adjustment needed for an equal number of low-to-high and high-to-low transitions would be only half that needed for the same number of high-to-low transitions without any accompanying low-to-high transitions. If the same were true, but there were only half as many low-to-high transitions as high-to-low transitions, the amount of timing adjustment needed would be three-quarters as much as that needed for the same number of high-to-low transitions without any accompanying low-to-high transitions.

In step 1108, the timing is controlled based on comparison of the difference in the respective numbers of the first-level-to-second-level transitions and the second-level-to-first-level transitions to a threshold. Step 1108 may include step 1109. In step 1109, the timing is controlled based on comparison of the difference in the respective numbers of the first-level-to-second-level transitions and the second-level-to-first-level transitions to a plurality of thresholds. The delay is adjusted a different amount for a first threshold than for a second threshold. In step 1110, the timing of the timing signal is controlled based on a relationship between respective numbers of a first set of the plurality of lines exhibiting first-level-to-second-level transitions, a second set of the plurality of lines exhibiting second-level-to-first-level transitions, and a third set of the plurality of lines exhibiting logic levels remaining unchanged during the first-level-to-second-level transitions of the first set of the plurality of lines and the second-level-to-first-level transitions of the second set of the plurality of lines. In one embodiment, the timing of the timing signal is later when the third set of the plurality of lines is smaller and earlier when the third set of the plurality of lines is larger.

Figure 12:
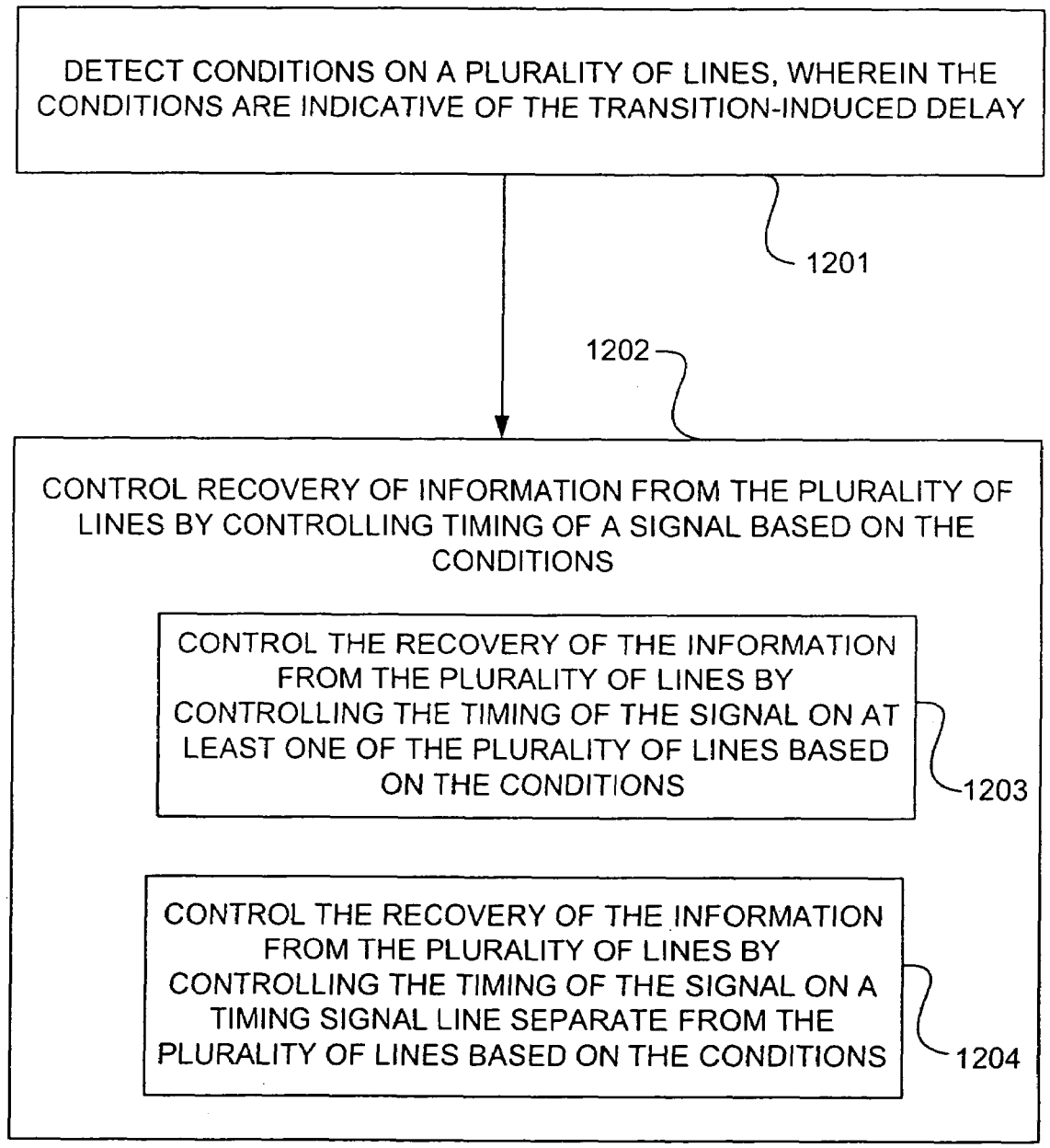
FIG. 12 is a flow diagram illustrating a method for accommodating transition-induced delay in accordance with an embodiment of the present invention.

FIG. 12 is a flow diagram illustrating a method for accommodating transition-induced delay in accordance with an embodiment of the invention. In step 1201, conditions indicative of transition-induced delay are detected on a plurality of lines. As an example, the conditions may be indicative of current flow through a power supply conductor. Such current flow can affect the voltage of the power supply conductor. In step 1202, recovery of information from the plurality of lines is controlled by controlling timing of a signal based on the conditions. Step 1202 may include step 1203 and/or step 1204. In step 1203, the recovery of the information from the plurality of lines is controlled by controlling the timing of the signal on at least one of the plurality of lines based on the conditions. In step 1204, the recovery of the information from the plurality of liens is controlled by controlling the timing of the signal on a timing signal line separate from the plurality of lines based on the conditions.

Figure 13:
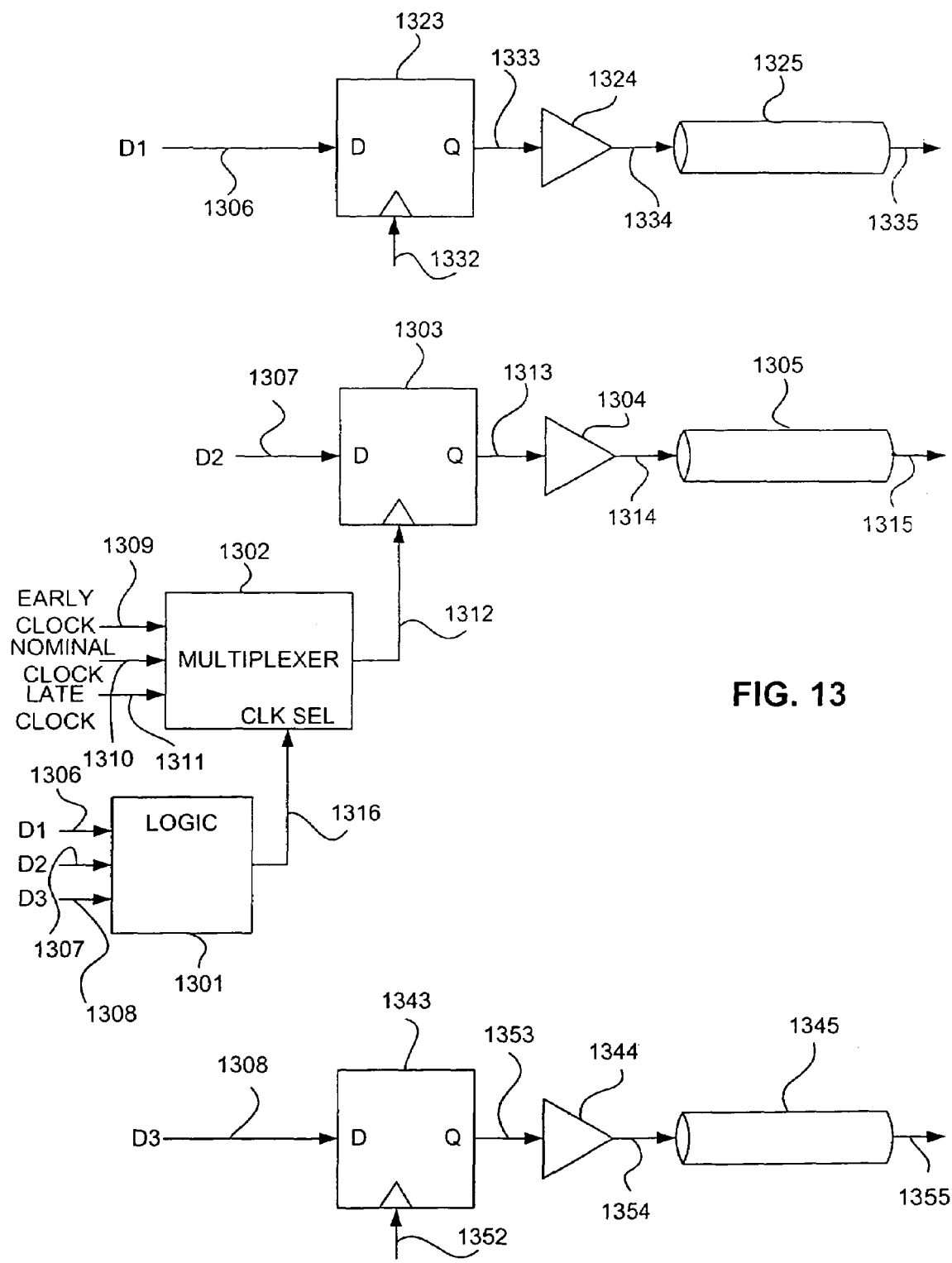
FIG. 13 is a block diagram illustrating an apparatus for accommodating delay variation among multiple signals in accordance with an embodiment of the present invention.

FIG. 13 is a block diagram illustrating an apparatus for accommodating transition-induced delay in accordance with an embodiment of the present invention. A transmit circuit is provided that provides compensation for pattern-dependent timing inaccuracies. The transmit circuit comprises a clock generation circuit, a clock selection circuit, and a pattern identification logic circuit. The clock generation circuit generates a nominal clock signal of nominal timing, as well as a early clock signal of earlier phase than the nominal clock signal and a late clock signal of later phase than the nominal clock signal. The nominal clock signal, early clock signal, and late clock signal are provided to inputs of a clock selection circuit. The clock selection circuit comprises multiplexer 1302. The output of the clock selection circuit is used as a transmit clock. For several signal lines, each signal line may be provided with its own clock selection circuit and pattern identification logic circuit. The pattern identification logic circuit comprises logic block 1301, which compares the signal to be transmitted with the signals to be transmitted on neighboring conductors and determines the appropriate transmit clock to be selected for that bit time.

The logic block 1301 receives three signals D1, D2, and D3 at inputs 1306, 1307, and 1308, respectively. For example, to compensate for the influence of signals present on adjacent conductors on the propagation of a signal along a conductor, this embodiment may be beneficially applied to a system in which signals D1 and D3 are carried along conductors routed adjacent to the conductor carrying signal D2. Logic block 1301 determines if signal D2 will make a transition of the same polarity (e.g., high-to-low or low-to-high) as both of signals D1 and D3, if signal D2 will make a transition of a polarity opposite that of both signals D1 and D3, or if neither of the above will occur.

If signal D2 will make a transition of the same polarity as both of signals D1 and D3, logic block 1301 provides a selection signal at output 1316 to multiplexer 1302 to cause multiplexer 1302 to pass an early clock signal at input 1309 to output 1312. If signal D2 will make a transition of a polarity opposite that of both signals D1 and D3, logic block 1301 provides a selection signal at output 1316 to cause multiplexer 1302 to pass a late clock signal at input 1311 to output 1312. If neither of the above conditions are present, logic block 1301 provides a selection signal at output 1316 to cause multiplexer 1302 to pass a nominal clock signal at input 1310 to output 1312. The clock signal at output 1312 is used to clock D flip-flop 1303, which receives signal D2 at input 1307 and provides output 1313 to driver 1304. Driver 1304 provides output 1314 for transmission through conductor 1305 to input 1315.

Other variations may be practiced. For example, if one adjacent conductor carries a signal that has a transition of the same polarity, while another adjacent conductor carries a signal that is not experiencing a transition at that time, an additional clock signal having a timing between the early clock and the nominal clock may be selected. Likewise, if one adjacent conductor carries a signal that has a transition of the opposite polarity, while another adjacent conductor carries a signal that is not experiencing a transition at that time, an additional clock signal having a timing between the late clock and the nominal clock may be selected. As another example, if similar and opposite transitions on adjacent conductors do not exactly cancel out their individual timing influences, a relatively slight adjustment may be made to compensate for that effect.

As another variation, compensation may be provided recursively or partially recursively. For example, since the timing of a signal on a conductor may be affected by the signals on conductors adjacent to it, and the timing of those signals on the adjacent conductors may be affected by signals on conductors adjacent to them, in theory, even signals on conductors relatively distant from a conductor may provide some contribution to the overall effect on timing. Thus, the effect of signals carried by conductors located relatively distant from a particular conductor may be considered in controlling the timing pertaining to that particular conductor. For example, different weighing factors may be applied based on transitions detected on conductors at different proximities to that particular conductor. It should also be understood that these techniques may be applied to timing signals, such as clock signals, to data signals, or to other signals that affect the timing relationships involved in recovering signals transmitted over a conductor. While adjustment within the transmit circuit has been described above, it should be understood that timing adjustment may be performed within a receive circuit. For example, information pertinent to the adjustment may be communicated from the transmit circuit, with the adjustment performed in the receive circuit, or the violation of timing requirements, such as setup and hold times, may be detected in the receive circuit and appropriate corrective adjustment performed in the receive circuit.

As another variation, a delay circuit may be substituted for the clock generation circuit and the clock selection circuit. The delay circuit can be used to introduce a desired amount of delay into one or more signals, which may include signals representing data being communicated or clock signals representing timing information used to communicate the data being communicated. The amount of delay provided can be adjusted based on an output of the pattern identification logic circuit. As an example, the output of the pattern identification logic circuit is indicative of a first outcome when the other signals to be transmitted on the neighboring conductors are of a similar state as the signal, a second outcome when one of the other signals to be transmitted on the neighboring conductors is of a similar state as the signal and another of the other signals to be transmitted on the neighboring conductors is of a different state than the signal, and a third outcome when the other signals to be transmitted on the neighboring conductors are of a different state than the signal. The delay circuit delays the signal by a nominal amount when the output indicates the second outcome, by a smaller than nominal amount when the output indicates the first outcome, and by a larger than nominal amount when the output indicates the third outcome.

Similar circuits are provided for signals D1 and D3. Because of their similarity, only a portion of these circuits is illustrated. Signal D1 is provided at input 1306 to D flip-flop 1323. D flip-flop 1323 is clocked by clock input 1332 to provide output 1333 to driver 1324. Driver 1324 provides output 1334 for transmission through conductor 1325 to input 1335. Signal D3 is provided at input 1308 to D flip-flop 1343. D flip-flop 1343 is clocked by clock input 1352 to provide output 1353 to driver 1344. Driver 1344 provides output 1354 for transmission through conductor 1345 to input 1355. It should be understood that the logic blocks for signals D1 and D3 (that correspond to logic block 1301 for signal D2) receive inputs for signals carried by conductors adjacent to the conductors carrying signals D1 and D3, respectively.

Thus, for example, the corresponding logic block for signal D1 would receive at its inputs signals D1, D2, and a signal other than signal D2 carried by a conductor disposed adjacent to the conductor carrying signal D1. As another example, the corresponding logic block for signal D3 would receive at its inputs signals D3, D2, and a signal other than signal D2 carried by a conductor disposed adjacent to the conductor carrying signal D3. It should be understood that an embodiment of the invention may be practiced on per pin and per bit time basis, where individual control of the timing of signals on each conductor is provided for each bit time, or on a more generalized basis, for example, where a similar timing adjustment is applied so as to affect the signals carried by multiple conductors. It should be noted that the tem "adjacent," as used above, is intended to include conductors separated from each other by other materials, for example, dielectric materials.

Figure 14:
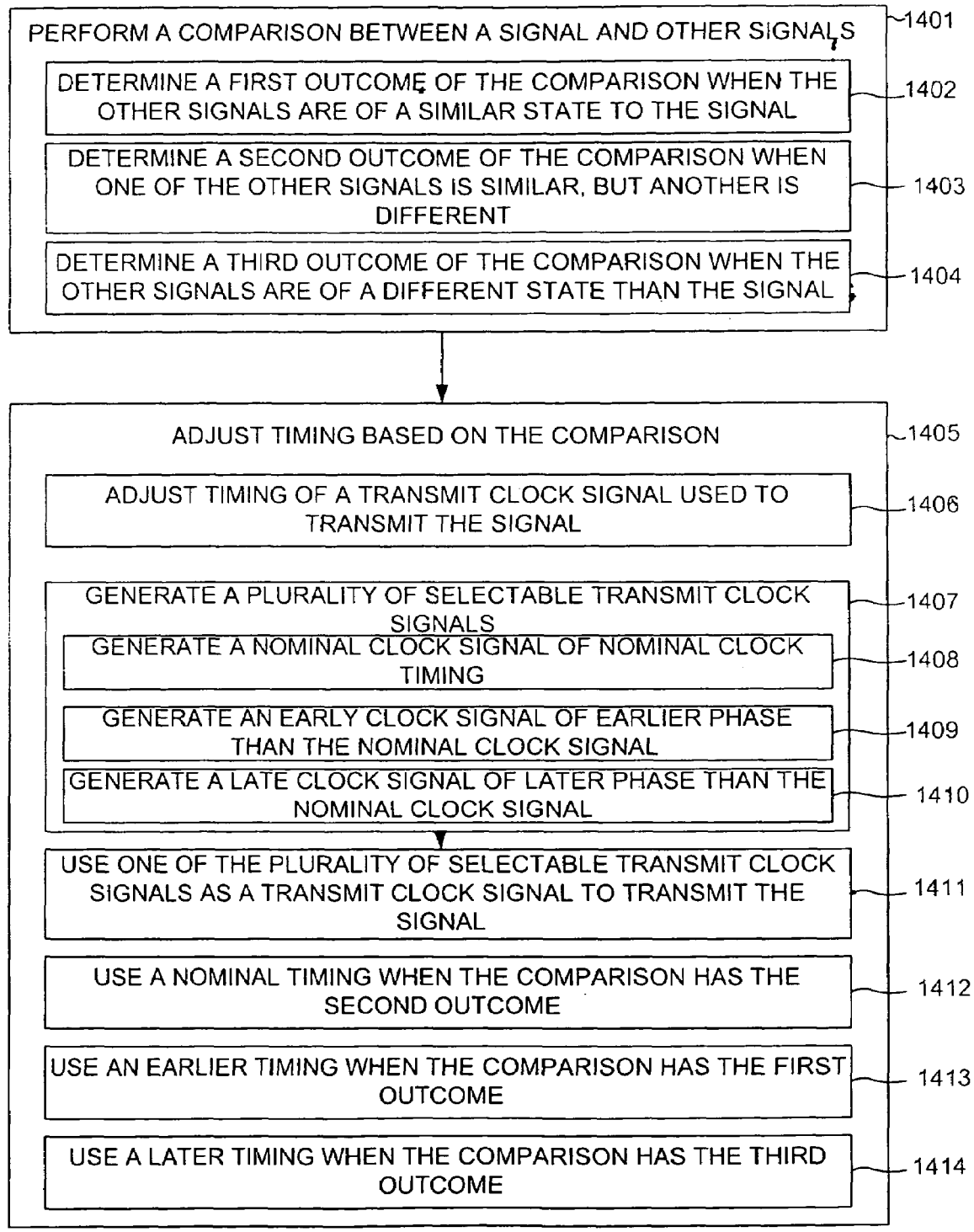
FIG. 14 is a flow diagram illustrating a method for accommodating delay variation among multiple signals in accordance with an embodiment of the present invention.

FIG. 14 is a flow diagram illustrating a method for accommodating delay variation among multiple signals in accordance with an embodiment of the present invention. The method begins in step 1401. In step 1401, a comparison is performed between a signal of the multiple signals to be transmitted on a conductor and other signals of the multiple signals to be transmitted on neighboring conductors. Step 1401 may include steps 1402-1404. In step 1402, a first outcome of the comparison is determined when the other signals to be transmitted on the neighboring conductors are of a similar state as the signal. In step 1403, a second outcome of the comparison is determined when one of the other signals to be transmitted on the neighboring conductors is of a similar state as the signal and another of the other signals to be transmitted on the neighboring conductors is of a different state than the signal. In step 1404, a third outcome of the comparison is determined when the other signals to be transmitted are of a different state than the signal.

From step 1401, the method continues in step 1405. In step 1405, timing is adjusted based on the comparison. Step 1405 may include steps 1406, 1407, and 1411-1414. In step 1406, timing of a transmit clock signal used to transmit the signal is adjusted. In step 1407, a plurality of selectable transmit clock signals are generated. Step 1407 may include steps 1408-1410. In step 1408, a nominal clock signal of nominal clock timing is generated. In step 1409, an early clock signal of earlier phase than the nominal clock signal is generated. In step 1410, a late clock signal of later phase than the nominal clock signal is generated. From step 1407, the method continues in step 1411.

In step, 1411, on of the plurality of selectable transmit clock signals is used as a transmit clock signal to transmit the signal. In step 1412, a nominal timing is used when the comparison has the second outcome. In step 1413, an earlier timing is used when the comparison has the first outcome. In step 1414, a later timing is used when the comparison has the third outcome.

As described above, embodiments of the invention may be used to compensate for effects resulting from simultaneous switching of multiple signals, for example, effects that involve changes in switching speed based on supply voltage or current transients, or for effects resulting from relationships of patterns of signals, for example, variations in propagation delay based on the influence of signals routed in close proximity to one another. Thus, transition-dependent effects and pattern-dependent effects can be compensated according to one or more embodiments of the invention. As noted previously, timing of signals can be adjusted to provide such compensation. Timing of either or both of an affected signal or a signal used to recover an affected signal may be adjusted. For example, timing of signals on a data bus and/or timing of a clock signal used to recover signals from the data bus may be adjusted.

Accordingly, although the present invention has been described in connection with certain specific embodiments for instructional purposes, the present invention is not limited thereto. Various modifications, adaptations, and combinations of various features of the described embodiments can be practiced without departing from the scope of the invention as set forth in the claims.

What is claimed is:

1. An Apparatus for accommodating transition-induced delay comprising:
   a transition detection block having a plurality of inputs, the plurality of inputs coupled to a plurality of lines, the transition detection block detecting transitions of the plurality of lines; and
   a delay adjustment block coupled to the transition detection block, the delay adjustment block adjusting a delay affecting a timing signal, wherein the delay is adjusted based upon a difference between a first number of the plurality of lines exhibiting a first type of the transitions and a second number of the plurality of lines exhibiting a second type of the transitions, wherein at least one of the plurality of lines is sampled in accordance with the timing signal.

2. The apparatus of claim 1, wherein the transition detection block detects the first type of the transitions from a first level to a second level and the second type of the transitions from the second level to the first level.

3. The apparatus of claim 2, wherein the difference defines a relationship between the first type of the transitions and the second type of the transitions.

4. A method for accommodating transition-induced delay comprising the steps of:
   detecting transitions on a plurality of lines; and
   controlling timing of a timing signal for sampling the plurality of lines based on a difference in respective numbers of a first type of the transitions and a second type of the transitions.

5. The method of claim 4, wherein the step of detecting transitions on the plurality of lines further comprises the steps of:
   detecting the first type of the transitions as first-level-to-second-level transitions on the plurality of lines; and
   detecting the second type of the transitions as second-level-to-first-level transitions on the plurality of lines.

6. The method of claim 5, wherein the step of controlling the timing of the timing signal for sampling the plurality of lines based on a difference in respective numbers of the first-level-to-second-level transitions and the second-level-to-first-level transitions further comprises the step of:
   delaying the timing of the timing signal when the difference in the respective numbers of the first-level-to-second-level transitions and the second-level-to-first-level transitions is increased.

7. The method of claim 5, wherein the step of controlling the timing of the timing signal for sampling the plurality of lines based on a difference in respective numbers of the first-level-to-second-level transitions and the second-level-to-first-level transitions further comprises the step of:
   controlling the timing of the timing signal differently when there are more of the first-level-to-second-level transitions than when there are more of the second-level-to-first-level transitions.

8. The method of claim 5, wherein the step of controlling the timing of the timing signal for sampling the plurality of lines based on a difference in respective numbers of the first-level-to-second-level transitions and the second-level-to-first-level transitions further comprises the step of:
   controlling the timing of the timing signal for sampling the plurality of lines based on a comparison of the difference in the respective numbers of the first-level-to-second-level transitions and the second-level-to-first-level transitions to a threshold.

9. The method of claim 8, wherein the step of controlling the timing of the timing signal for sampling the plurality of lines based on a comparison of the difference in the respective numbers of the first-level-to-second-level transitions and the second-level-to-first-level transitions to a threshold further comprises the step of:
   controlling the timing of the timing signal for sampling the plurality of lines based on comparison of the difference in the respective numbers of the first-level-to-second-level transitions and the second-level-to-first-level transitions to a plurality of thresholds, with the delay adjusted a different amount for a first threshold of the plurality of thresholds than for a second threshold of the plurality of thresholds.

10. The method of claim 5, wherein the step of controlling the timing of the timing signal for sampling the plurality of lines based on the transitions on the plurality of lines further comprises the step of:
    controlling the timing of the timing signal for sampling the plurality of lines based on a relationship between respective numbers a first set of the plurality of lines exhibiting first-level-to-second-level transitions, a second set of the plurality of lines exhibiting second-level-to-first-level transitions, and a third set of the plurality of lines exhibiting logic levels remaining unchanged during the first-level-to-second-level transitions of the first set of the plurality of lines and the second-level-to-first-level transitions of the second set of the plurality of lines.

11. The method of claim 10, wherein the timing of the timing signal is later when the third set of the plurality of lines is smaller and earlier when the third set of the plurality of lines is larger.

12. A method for accommodating transition-induced delay comprising the steps of:
    detecting conditions on a plurality of lines, wherein the conditions are indicative of the transition-induced delay; and controlling recovery of information from the plurality of lines by controlling timing of a signal on a timing signal line separate from the plurality of lines based on the conditions.

13. The method of claim 12, wherein the step of controlling the recovery of the information from the plurality of lines by controlling the timing of the signal based on the conditions further comprises the step of:
controlling the recovery of the information from the plurality of lines by also controlling the timing of the signal on at least one of the plurality of lines based on the conditions.

14. The method of claim 12, wherein the conditions are further indicative of current flow through a power supply conductor, the current flow affecting a voltage of the power supply conductor.

15. A method for accommodating delay variation among multiple signals comprising the steps of:
performing a comparison between a signal of the multiple signals to be transmitted on a conductor and other signals of the multiple signals to be transmitted on neighboring conductors; and
adjusting timing based on the comparison.

16. The method of claim 15, wherein the step of adjusting timing comprises the step of:
adjusting timing of a transmit clock signal used to transmit the signal.

17. The method of claim 15, wherein the step of adjusting timing comprises the steps of:
generating a plurality of selectable transmit clock signals; and
using one of the plurality of the selectable transmit clock signals as a transmit clock signal to transmit the signal.

18. The method of claim 17, wherein the step of generating a plurality of selectable transmit clock signals comprises the steps of:
generating a nominal clock signal of nominal clock timing;
generating an early clock signal of earlier phase than the nominal clock signal; and
generating a late clock signal of later phase than the nominal clock signal.

19. The method of claim 15, wherein the step performing a comparison comprises the steps of:
determining a first outcome of the comparison when the other signals to be transmitted on the neighboring conductors are of a similar state as the signal;
determining a second outcome of the comparison when one of the other signals to be transmitted on the neighboring conductors is of a similar state as the signal and another of the other signal's to be transmitted on the neighboring conductors is of a different state than the signal; and
determining a third outcome of the comparison when the other signals to be transmitted on the neighboring conductors are of a different state than the signal.

20. The method of claim 19, wherein the step of adjusting timing further comprises the steps of:
using a nominal timing when the comparison has the second outcome;
using an earlier timing when the comparison has the first outcome; and
using a later timing when the comparison has the third outcome.

21. The method of claim 19, wherein the step of adjusting timing further comprises the steps of:
delaying the signal by a nominal amount when the comparison has the second outcome;
delaying the signal by a smaller than nominal amount when the comparison has the first outcome; and
delaying the signal by a larger than nominal amount when the comparison has the third outcome.

22. The method of claim 15, wherein the step of adjusting timing comprises the step of:
adjusting a delay of the signal.

23. An apparatus for accommodating delay variation among multiple signals comprising:
a clock generation circuit for generating a plurality of selectable clock signals;
a pattern identification logic circuit for comparing a signal of the multiple signals to other signals of the multiple signals to be transmitted on neighboring conductors; and
a clock selection circuit for selecting among the plurality of selectable clock signals based on an output of the pattern identification logic circuit.

24. The apparatus of claim 23, wherein the plurality of selectable clock signals comprise a nominal clock signal of nominal timing, an early clock signal of earlier phase than the nominal clock signal, and a late clock signal of later phase than the nominal clock signal.

25. The apparatus of claim 24, wherein the clock selection circuit selects the early clock signal when the other signals are of a similar state as the signal.

26. The apparatus of claim 24, wherein the clock selection circuit selects the late clock signal when the other signals are of a different state than the signal.

27. The apparatus of claim 24, wherein the clock selection circuit selects the nominal clock signal when one of the other signals is of a similar state as the signal and another of the other signals is of a different state than the signal.

28. The apparatus of claim 23, wherein the clock selection circuit comprises a multiplexer.

29. An apparatus for accommodating delay variation among multiple signals comprising:
a pattern identification logic circuit for comparing a signal of the multiple signals to other signals of the multiple signals to be transmitted on neighboring conductors; and
a delay circuit for delaying the signal based on an output of the pattern identification logic circuit.

30. The apparatus of claim 27, wherein the output of the pattern identification logic circuit is indicative of a first outcome when the other signals to be transmitted on the neighboring conductors are of a similar state as the signal, a second outcome when one of the other signals to be transmitted on the neighboring conductors is of a similar state as the signal and another of the other signals to be transmitted on the neighboring conductors is of a different state than the signal, and a third outcome when the other signals to be transmitted on the neighboring conductors are of a different state than the signal.

31. The apparatus of claim 30, wherein the delay circuit delays the signal by a nominal amount when the output indicates the second outcome, by a smaller than nominal amount when the output indicates the first outcome, and by a larger than nominal amount when the output indicates the third outcome.

* * * * *